(12) United States Patent
Dinger et al.

(10) Patent No.: US 8,398,865 B2
(45) Date of Patent: Mar. 19, 2013

(54) METHOD OF MANUFACTURING A MICROMECHANICAL PART

(75) Inventors: Rudolf Dinger, Saint-Aubin (CH); Thierry Ravenel, Hauterive (CH)

(73) Assignee: The Swatch Group Research and Development Ltd, Marin (CH)

( * ) Notice: Subject to any disclaimer, the term of this patent is extended or adjusted under 35 U.S.C. 154(b) by 734 days.

(21) Appl. No.: 12/501,009

(22) Filed: Jul. 10, 2009

(65) Prior Publication Data

US 2010/0006540 A1    Jan. 14, 2010

(30) Foreign Application Priority Data

Jul. 10, 2008 (EP) .................................... 08160141

(51) Int. Cl.
*C23F 1/00* (2006.01)

(52) U.S. Cl. .................. 216/2; 216/39; 216/41; 216/67; 216/74; 29/896.3

(58) Field of Classification Search ........................ None
See application file for complete search history.

(56) References Cited

U.S. PATENT DOCUMENTS

| 6,869,676 | B2 * | 3/2005 | Burger et al. ................. 428/336 |
| 2008/0198702 | A1 * | 8/2008 | Meister et al. ................ 368/232 |
| 2010/0054092 | A1 * | 3/2010 | Marmy et al. ................ 368/324 |

FOREIGN PATENT DOCUMENTS

| JP | 11-48342 | | 2/1999 |
| WO | WO2006122873 | * | 11/2006 |
| WO | WO2008055844 | * | 5/2008 |

OTHER PUBLICATIONS

M. Madou, Fundamentals of Microfabrication, CRC Press, 1997, ISBN 0-8493-9451-1, pp. 2-9.*
A. Perret et al., Proceedings of SPIE, vol. 4755, 2002, pp. 645-647.*
Gluche et al., MST News, No. 3/08, 2008, pp. 15-17.*
Perret A: "Le Silicum comme materiau dans la fabrication de pieces mecaniques," Bulleting de la Societe Suisse de Chronometrie, SSC, Neuchatel, CH, No. 38, Nov. 9, 2001, pp. 27-29.
Database WPI Week 199918, Thomson Scientific, London, GB; AN 1999-209545 (as cited in the European Search Report.
European Search Report issued in corresponding application No. EP 08 16 0141, completed Feb. 2, 2009.
Noel W et al., "MEMS for watches," Micro Electro Mechanical Systems, 2004. 17th IEEE International Conference on (MEMS) Maastricht, Netherlands, Jan. 25, 2004, pp. 1-4.

* cited by examiner

*Primary Examiner* — Lan Vinh
*Assistant Examiner* — Jiong-Ping Lu
(74) *Attorney, Agent, or Firm* — Griffin & Szipl, P.C.

(57) ABSTRACT

A method of manufacturing a mechanical part includes the steps of providing a micro-machinable substrate; etching a pattern which includes the part through the entire substrate using photolithography; mounting the etched substrate on a support so as to leave the top and bottom surfaces of said substrate accessible for coating; depositing a tribological quality improving coating of on the outer surface of the part; and releasing the part from the substrate.

29 Claims, 8 Drawing Sheets

METHOD OF MANUFACTURING A MICROMECHANICAL PART

This application claims priority from European Patent Application No. 08160141.1 filed Jul. 10, 2008, the entire disclosure of which is incorporated herein by reference.

FIELD OF THE INVENTION

The invention relates to a method of manufacturing a mechanical part made from a micro-machinable material and, more specifically, a part of this type that will be used for manufacturing a timepiece.

BACKGROUND OF THE INVENTION

Manufacturing a timepiece part in a crystalline, silicon-based material is known. Indeed, the use of a micro-machinable material like crystalline silicon has advantages in terms of manufacturing precision, owing to advances in current methods particularly within the electronics field. Thus, while it may be possible to manufacture balance springs, it is not yet possible to apply micro-machinable materials to all timepiece parts because of their insufficient tribological properties. Moreover, current manufacturing methods remain complex to implement and require direct handling of the manufactured parts, at the risk of damage to such parts.

SUMMARY OF THE INVENTION

It is an object of the present invention to overcome all or part of the aforecited drawbacks by proposing a method that allows simple, high quality manufacture of a micro-mechanical part that can be applied to most mechanical timepiece parts. Moreover, the method allows, simple, reliable pre-assembly of the part preventing any handling of the functional portions thereof so that the part is ready to be mounted in a device, such as a timepiece, without having to be touched.

The invention therefore relates to a method of manufacturing a mechanical part including the following steps:
a) providing a substrate made of micro-machinable material;
b) etching, with help of photolithography, a pattern that includes said part through said entire substrate;
characterized in that it further includes the following steps:
c) mounting said etched substrate on a support so as to leave the top and bottom surfaces of said substrate accessible;
d) depositing a coating of better tribological quality than said micro-machinable material on the outer surface of said part.
e) releasing the part from the substrate.
According to other advantageous features of the invention:
step c) includes these steps: f) guiding the substrate relative to said support using alignment means so as to orient said substrate reliably and g) sliding the substrate against at least one pin secured to the support until the substrate abuts against a shoulder of said at least one pin made at a distance from said support so as to hold the substrate high up relative to said support;
the alignment means are located higher than said at least one pin and said forks so as to guarantee the consecutiveness of steps f) then g);
the support includes several alignment means so as to improve the guiding in step f);
in step b) at least one bridge of material is etched in the pattern so as to kept the part secured to the substrate;
said at least one bridge of material includes a narrow section at the end connected to said part for creating a zone of weakness that facilitates step e);
step e) is achieved by a relative movement between the substrate and the part so as to break said at least one bridge of material;
after step e) the method includes step h) assembling a clip on said part so that said part is ready to be mounted without the portion made of micro-machinable material having to be touched;
step h) includes these steps: i) mounting a counter-support fitted with forks on said support so that the forks cooperate with said part, j) turning the support-counter-support assembly over then removing the support so as to slide said part against the forks and k) mounting a clip on the part;
step i) includes these steps: guiding the counter-support relative to said support using alignment means to orient said counter-support reliably and sliding at least one tube and the forks respectively against a pin secured to the support and the part until they abut against a shoulder of said pin so as to prepare for the support-counter-support assembly to be turned over;
steps e) and d) can be inverted;
several parts are manufactured from the same substrate;
said micro-machinable material is selected from the group including crystalline silicon, crystalline silica and crystalline alumina.

BRIEF DESCRIPTION OF THE DRAWINGS

Other features and advantages will appear more clearly from the following description, given by way of non-limiting indication, with reference to the annexed drawings, in which.

DETAILED DESCRIPTION OF THE PREFERRED EMBODIMENTS

Figure 8:
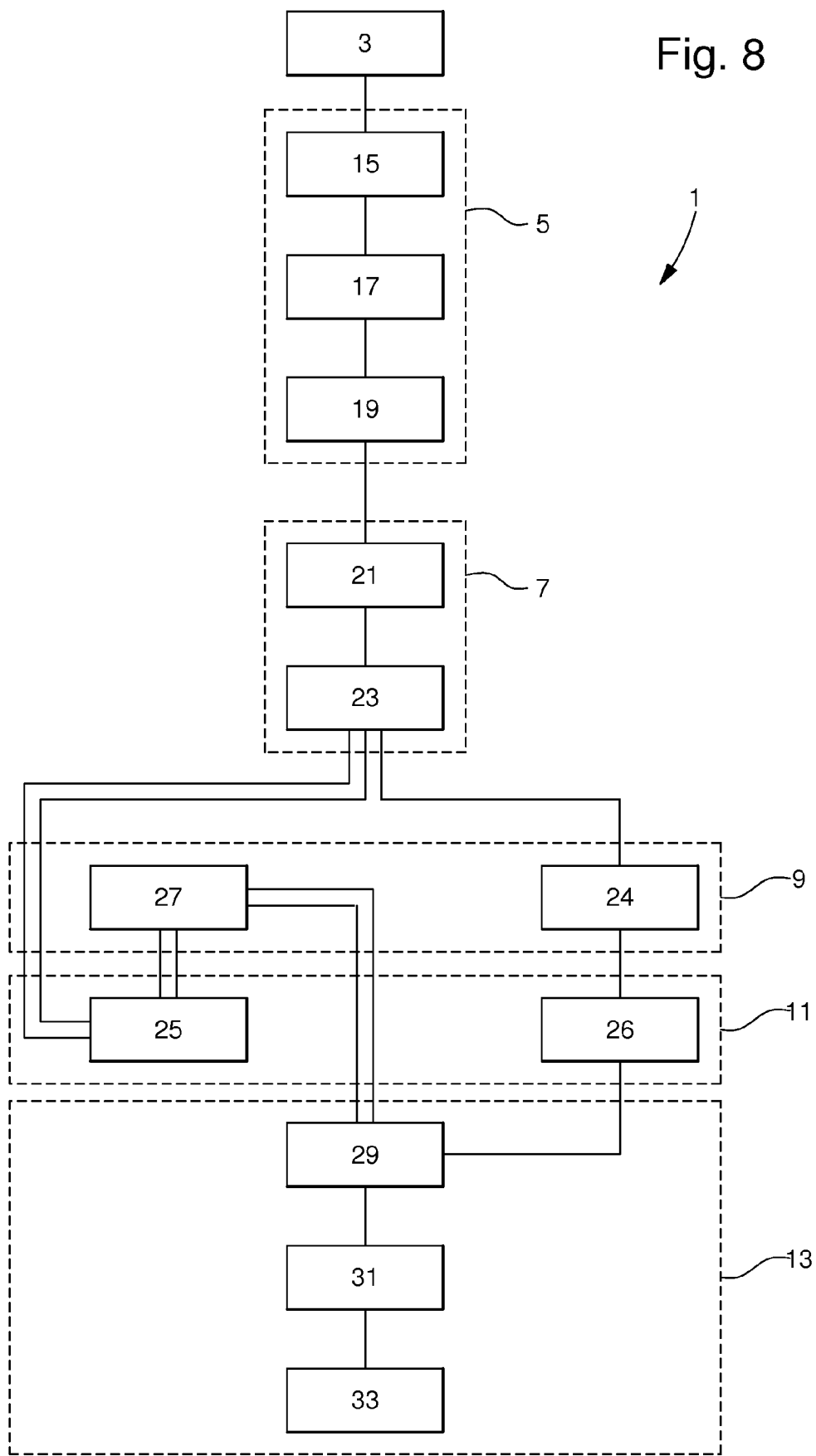
FIG. 8 is a flow chart of the method of the invention.

The example illustrated in FIG. 8 shows the flow chart of a method that is generally designated 1. Method 1 mainly includes six steps 3, 5, 7, 9, 11 and 13 for manufacturing a mechanical part 51, whose core is made from a base of micro-machinable material. Indeed, because of its precision of less than a micrometer, a micro-machinable material, is particularly useful for manufacturing, for example, a timepiece part and advantageously replaces the metal material that is usually used.

In the following explanation, the micro-machinable material may be crystalline silicon-based like, for example, mono-crystalline silicon, crystalline silica, like quartz, or crystalline alumina, like corundum (also called synthetic sapphire). Evidently, other micro-machinable materials could be envisaged.

Step 3 consists in taking a substrate 53, made of micro-machinable material like, for example, a mono-crystalline silicon wafer used for manufacturing electronic components. Preferably, a thinning phase is provided in step 3 so as to adapt the final thickness of part 51. This phase may be achieved by a mechanical or chemical back lapping technique.

Step 5 consists in making a pattern 50, which includes the mechanical part 51 to be manufactured, through the entire substrate 53, by photolithography, then etching. Advantageously, as can be seen in FIGS. 1 and 2, the larger size of substrate 53 relative to that of part 51 allows several patterns 50 to be etched and thus several parts 51 to be manufactured from the same substrate 53.

Figure 1:
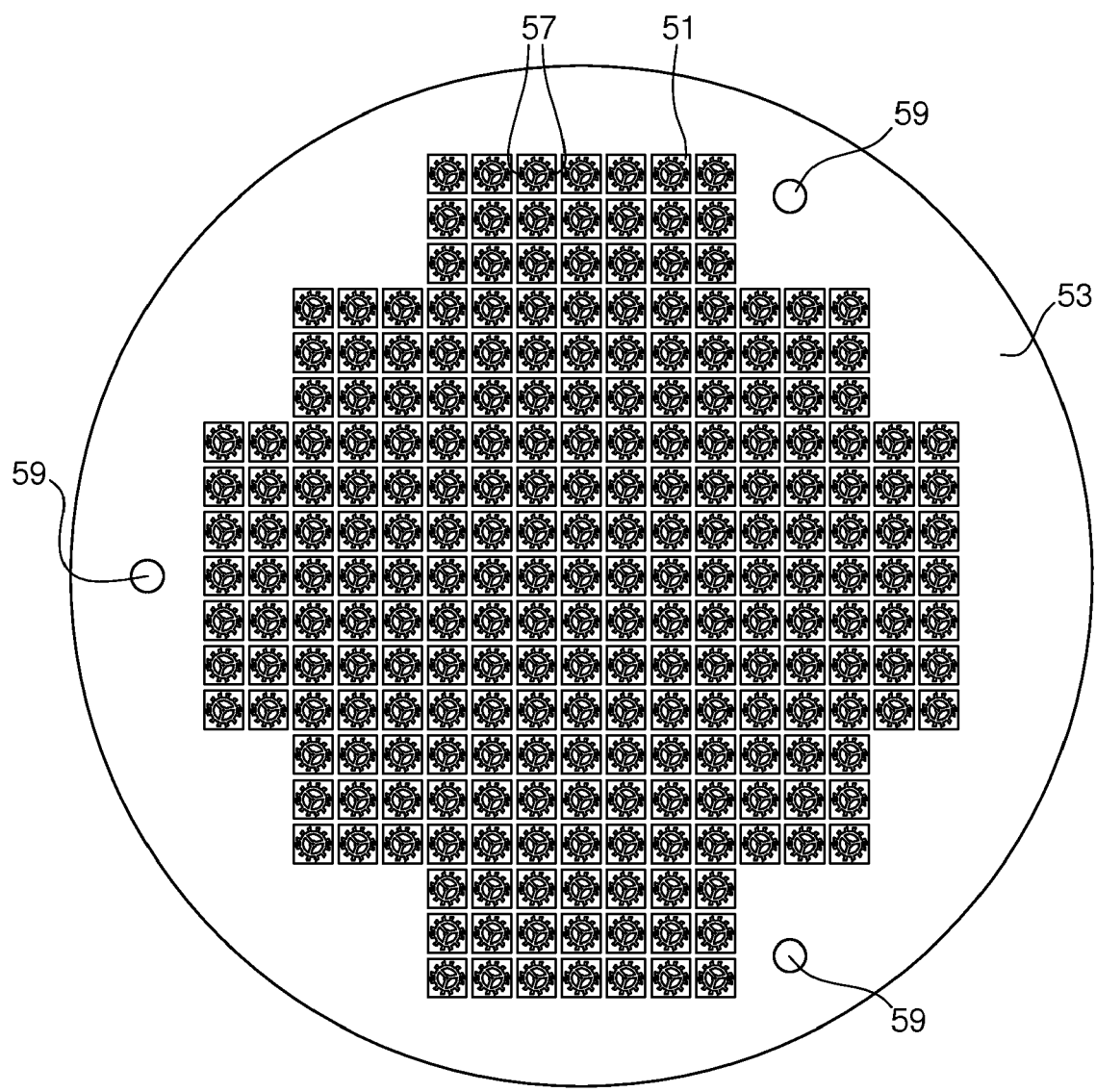
FIG. 1 is a diagram of a substrate after a photolithography and etch step.
Figure 2:
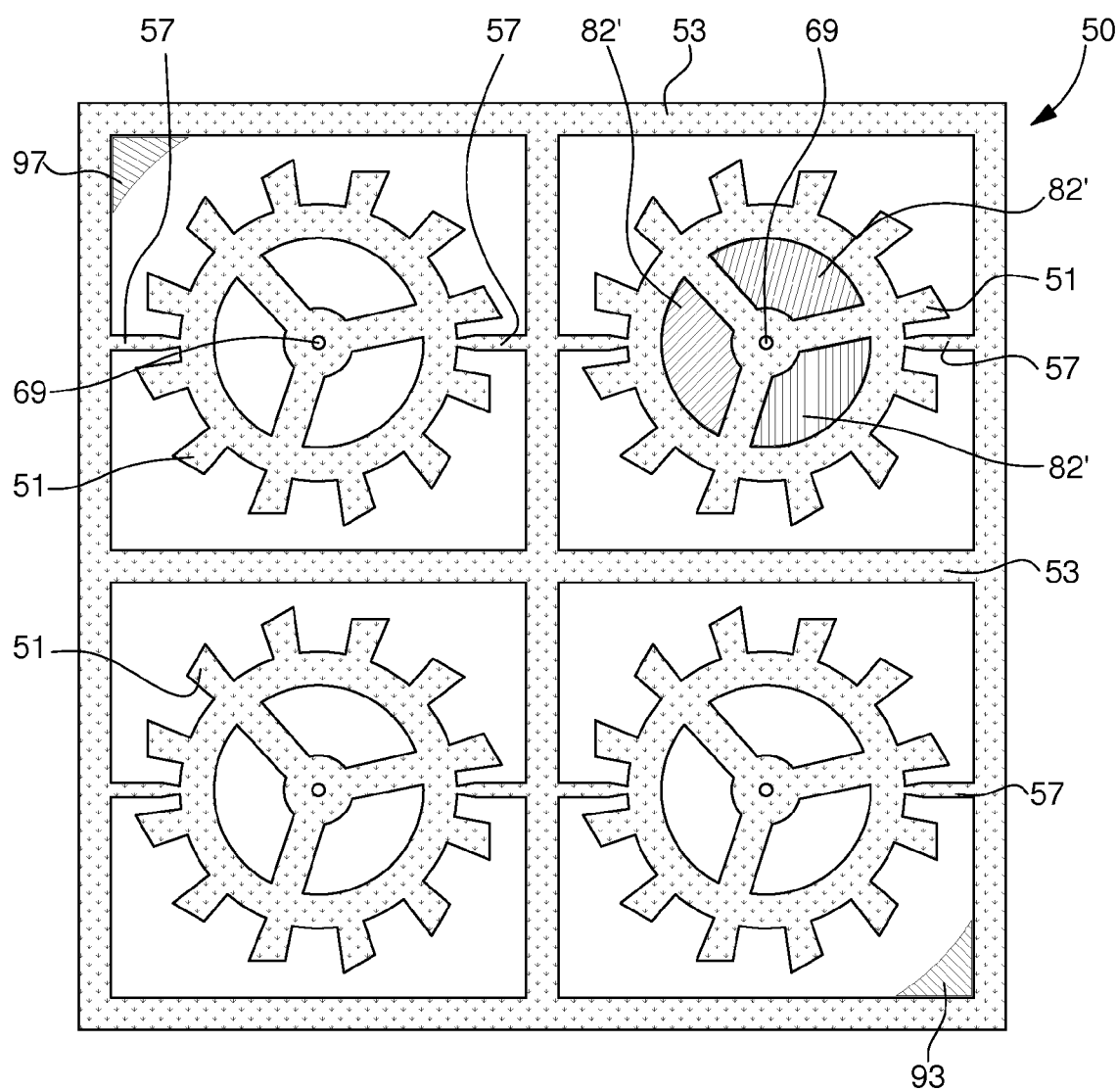
FIG. 2 is an enlargement of one part of FIG. 1.

In the example illustrated in FIGS. 1 and 2, each mechanical part 51 is an escape wheel for a timepiece. Of course, method 1 allows other timepiece parts to be manufactured, but also, as explained below, several different parts on the same substrate 53.

Step 7 consists in mounting the etched substrate 53, on a support 55', so as to leave its top and bottom surfaces accessible. This step facilitates implementation of step 9, which consists in depositing a coating of better tribological quality than said micro-machinable material on the external surface of part 51. Indeed, placing substrate 53 higher than support 55' facilitates deposition of the coating in that it allows the top, thickness and bottom of each part 51 to be accessed.

Step 9 allows deposition of a coating that advantageously replaces any insufficient tribological qualities of the micro-machinable material.

This coating may, for example, be carbon allotrope based. One could also envisage depositing a crystalline carbon coating like synthetic diamond by chemical phase deposition (CVD). Amorphous carbon such as diamond-like-carbon (DLC) could also be deposited by phase vapour deposition (PVD). Of course, one or several other materials could be used as a replacement or addition to carbon. Other deposition methods could also be envisaged.

Step 11 consists in releasing each part 51 from substrate 53. Thus, in the example illustrated in the Figures, according to method 1, several dozen mechanical parts 51 can be obtained on the same substrate 53. Step 13 consists in assembling a clip 91' on the part 51 using a counter-support 81' so that the pre-assembled part 51 is ready to be mounted without the part made of micro-machinable material having to be touched.

In the example illustrated in FIGS. 1 to 7, one could thus obtain, for example, escape wheels whose core is made of mono-crystalline silicon and, in accordance with the embodiments explained below, which include an external surface made of synthetic diamond and/or a pre-assembled clip 91.

From the main steps 3, 5, 7, 9 and 11 each of the embodiments will now be explained. In a first embodiment, method 1 includes the consecutive steps 3, 5, 7, 9 and 11 illustrated by a single line in FIG. 8. The first step 3 consists in taking a substrate 53 made of micro-machinable material.

Then the second step 5 consists in making patterns 50, each including a mechanical part 51 to be manufactured, through the entire substrate 53 by photolithography then etching. According to the first embodiment illustrated in the flow chart of FIG. 8, the second step 5 includes three phases 15, 17 and 19.

In a first phase 15, a protective mask is structured on substrate 53. Preferably, the protective mask is made using a photosensitive resin. The protective mask is thus formed using selective radiation for structuring said mask in a shape corresponding to each pattern 50 to be made. Because of this step 15, it will be possible to etch any flat shape selectively on substrate 53 in a very precise manner.

In a second phase 17, an anisotropic etch of the substrate 53-protective mask assembly is performed. A deep reactive ionic etch (DRIE) is preferably used. The anisotropic etch can etch substrate 53 in an approximately rectilinear manner in the zones that are not protected by said protective mask. The etch during second phase 17 is preferably carried out over the entire thickness of substrate 53 and, possibly, along a crystallographic axis of the micro-machinable material that is favourable to such etch.

Moreover, according to the invention, each pattern 50, as illustrated in FIGS. 1 and 2, preferably has two bridges of material 57. These bridges enable part 51 to be held in place relative to substrate 53 until step 11. As visible in FIG. 2, bridges of material 57 include a narrow section at the end of part 51 connected to the pattern for creating a zone of weakness that can facilitate release step 11.

Finally, according to the first embodiment, the second phase 17 is also used for etching holes 59, forming a part of the alignment means, in substrate 53. In the example illustrated in FIG. 1, it can be seen that three holes 59 have been formed, distributed at approximately 120 degrees from each other and in proximity to the ends of substrate 53.

In a third and last phase 19 of second step 5, the protective mask is removed from the surface of substrate 53. A substrate 53 is then obtained that includes several patterns 50 including a part 51 secured to substrate 53 by two bridges of material 57 as illustrated in FIGS. 1 and 2. Of course, in step 5, one could envisage making a single bridge of material 57 or more than two.

According to the first embodiment, the third step 7 consists in mounting the etched substrate 53 on a support 55' so as to leave the top and bottom surfaces of substrate 53 accessible in order to prepare for deposition step 9. As illustrated in FIG. 8, the third step 7 includes phases 21 and 23.

Figure 3:
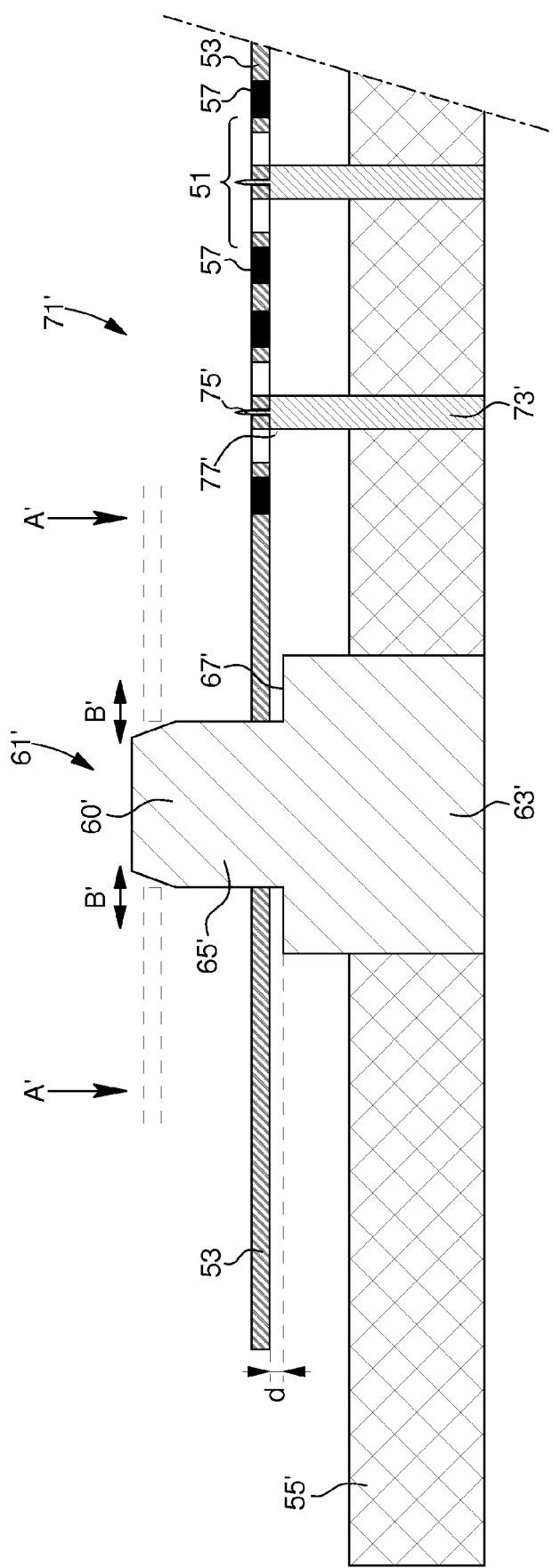
FIG. 3 is a diagram of a step of assembly onto a support according to the invention.

FIG. 3 illustrates an example support 55' according to the first embodiment. Support 55' is a plate, the material of which can withstand the temperatures of step 9, such as, for example, a ceramic. In order to suspend substrate 53 relative to support 55', the support has stems 61' and pins 71' for cooperating respectively with recesses 59 and holes 69 of parts 51 all made in substrate 53 during step 5. For the same reasons as support 55', stems 61' and pins 71' are preferably made of tungsten or tantalum.

Preferably, each generally cylindrical stem 61' has a low part 63' connected to a high part 65' of smaller section by means of a shoulder 67'. The low part 63' is mounted approximately perpendicularly in support 55' in a fixed manner. In the extension of the high part 65' there is a chamfered column 60' that belongs to alignment means cited below.

Preferably, each generally cylindrical pin 71' has a low part 73' connected to a high part 75' of smaller section by means of a shoulder 77'. The low part 73' is mounted approximately perpendicularly in support 55' in a fixed manner. High part 75' ends in a point to facilitate entry into its associated hole 69.

In the first phase 21, as seen in FIG. 3, by moving substrate 53 closer to support 55' along direction A', substrate 53 is guided along directions B' using alignment means so that substrate 53 is reliably oriented relative to support 55'.

In a second phase 23, continuing to move closer along translation A', substrate 53 slides against each high part 65' of stems 61' then also against each high part 75' of pins 71' until substrate 53 is approximately abutting against shoulder 77' of each pin 71'. As seen in FIG. 3 at the end of step 7, substrate 53 is stably positioned and its only degree of freedom is in translation A' upwards. It can also be seen that substrate 53 is also high relative to shoulders 67' of stems 61' along the distance d illustrated in FIG. 3.

In the example illustrated in FIG. 2, on patterns 50 at the bottom right, and at the top left, a variant can be seen of alignment means column 60'-hole 59. This variant is provided where the space at the ends of substrate 53 means that holes 59 cannot be made. According to the variant, two columns 93, 97 are provided that each cooperate with an empty part of a pattern 50. The two patterns 50 are preferably as far as possible from each other and each is in proximity to the ends of substrate 53. In the example illustrated in FIG. 2, it can be seen that each column 93 and 97 of approximately trigonal shape cooperates with a different pattern 50 along a central symmetry in order to improve guiding in step 21. The symmetry is preferably achieved relative to the centre of substrate 53 and uses patterns 50 to the top left and bottom right of the example illustrated in FIG. 1.

Preferably, alignment means 60', 59, 93, 97 are located higher vertically than stems 61' and pins 71' so as to guarantee the consecutiveness of phases 21 then 23.

Figure 4:
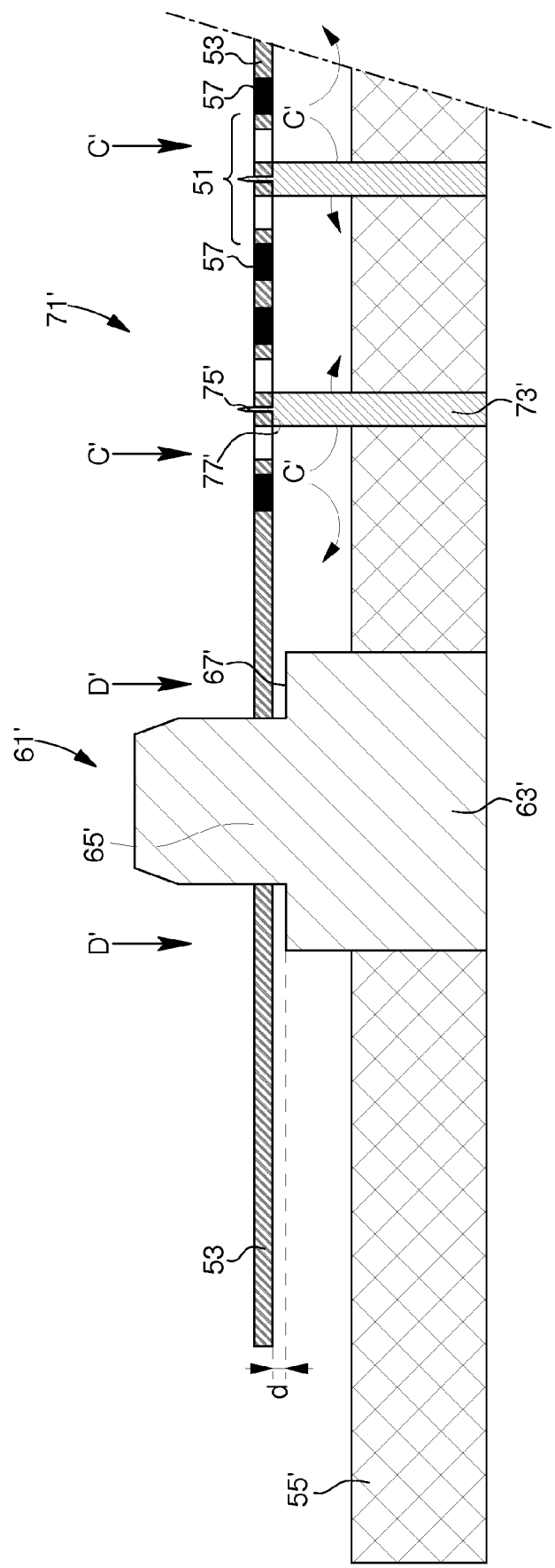
FIG. 4 is a diagram of a coating deposition step.

According to the first embodiment, the fourth step 9 consists in a phase 24 of depositing a coating on the outer surface of each part 51. As explained above, the coating may, for example, be a carbon allotrope for improving the tribology of each part 51, particularly by reducing its friction coefficient. As illustrated in FIG. 4 by arrow C', in phase 24 a coating is deposited below, across the thickness of and above each part 51 via step 7 for placing substrate 53 high up and because substrate 53 was etched right through in step 5.

According to the first embodiment, the fifth step 11 includes phase 26 consisting in releasing each part 51 from substrate 53. This phase 26 is achieved by moving each part 51 relative to substrate 53 so as to break bridges 57 that are retaining it. Phase 26 can be achieved by pushing substrate 53 along arrows D' that are visible in FIG. 4, towards shoulders 67' of each stem 61' manually or by using an automated machine.

The pushing then decreases distance d between substrate 53 and shoulder 67' of each stem 61'. However, as each part 51 is already abutting against shoulder 77' of its pin 71', the pushing thus causes a relative movement of substrate 53 in relation to each part 51, which causes a break at the intersection of each bridge of material 57 with its associated part 51. It is thus clear that after phase 26, each part 51 is only held against its pin 71' via its hole 69 and, lower down, substrate 53 is held against shoulders 67' of stems 61' because of its recesses 59 as shown in dotted lines in FIG. 5.

The first embodiment of method 1 thus produces a mechanical part 51, whose core of micro-machinable material, such as mono-crystalline silicon, is coated with a layer, such as for example of crystalline or amorphous carbon.

After the explanation of the first embodiment, it is clear that a second embodiment is possible. Indeed, because each part 51 is carried by its own pin 71' during step 11, it is possible to invert steps 9 and 11 as illustrated in FIG. 8 by a double line. Thus, method 1 according to the second embodiment includes the consecutive steps 3, 5, 7, 11 and 9. Steps 3, 5, and 7 are identical to those of the first embodiment, and they will not therefore be described in detail again.

After the third step 7, the fourth step 11 includes phase 25, which consists in releasing each part 51 from substrate 53. This phase 25 is achieved by moving each part 51 relative to substrate 53 so as to break bridges 57 that are retaining it. Phase 25 may be achieved by pushing substrate 53 along the arrows D' visible in FIG. 4 towards shoulders 67' of each stem 61' manually or using an automated machine. Each part 51 is thus carried by its pin 71' which is secured to support 55'. It is clear thus that substrate 53 can be removed.

According to the second embodiment, the fifth step 9 consists in a phase 27 of depositing a coating on the outer surface of each part 51. As explained above, the coating may, for example, be a carbon allotrope for improving the tribology of each part 51, particularly by reducing its friction coefficient. As explained above, in phase 27 a coating is deposited below, across the thickness of and above each part 51 owing to step 7 which places substrate 53 high up but also advantageously according to the second embodiment because substrate 53 was removed in step 11.

In this regard, it is also clear that advantageously according to the second embodiment, the thickness of each part 51 is coated over a larger surface than by the first embodiment because bridges of material 57 have already been removed with substrate 53 in fourth step 11.

The second embodiment of method 1 thus produces, in as simple a manner as the first embodiment, a mechanical part 51, whose core of micro-machinable material such as, for example, monocrystalline silicon, is coated with a layer such as, for example, of crystalline or amorphous carbon.

After each of the two embodiments explained above, method 1 may include a sixth step 13 that consists in assembling a clip 91' on part 51 using a counter-support 81' so that the pre-assembled part 51 is ready to be mounted with the part made of micro-machinable material having to be touched. Step 13 includes phases 29, 31 and 33.

The first phase 29 consists in mounting a counter-support 81', fitted with forks 87', along direction E' on support 55' so that the teeth 82' of one fork 87' cooperate with each part 51 and thus prepare for the assembly of clip 91'. As visible in FIG. 5, first of all by moving counter-support 81' relative to support 55' along direction E', counter-support 81' is guided using alignment means so that counter-support 81' is oriented reliably relative to support 55'.

The alignment means are preferably formed by a chamfered column 60', which was already used in phase 21 of step 7, mounted in the extension of the top part 65' and cooperating with one of the tubular parts 85' secured to counter-support 81'. Method 1 preferably includes three alignment means 60', 85' so as to improve guiding in first phase 29.

Secondly and lastly, by continuing to bring counter-support 81' closer to support 55' along translation E', each fork 87', then each tubular part 85' respectively slide against a part 51 and each high part 65' of stems 61' both of which are carried by support 55'. The second time period ends when counter-support 81' abuts against the shoulder 67' of each stem 61'.

Figure 5:
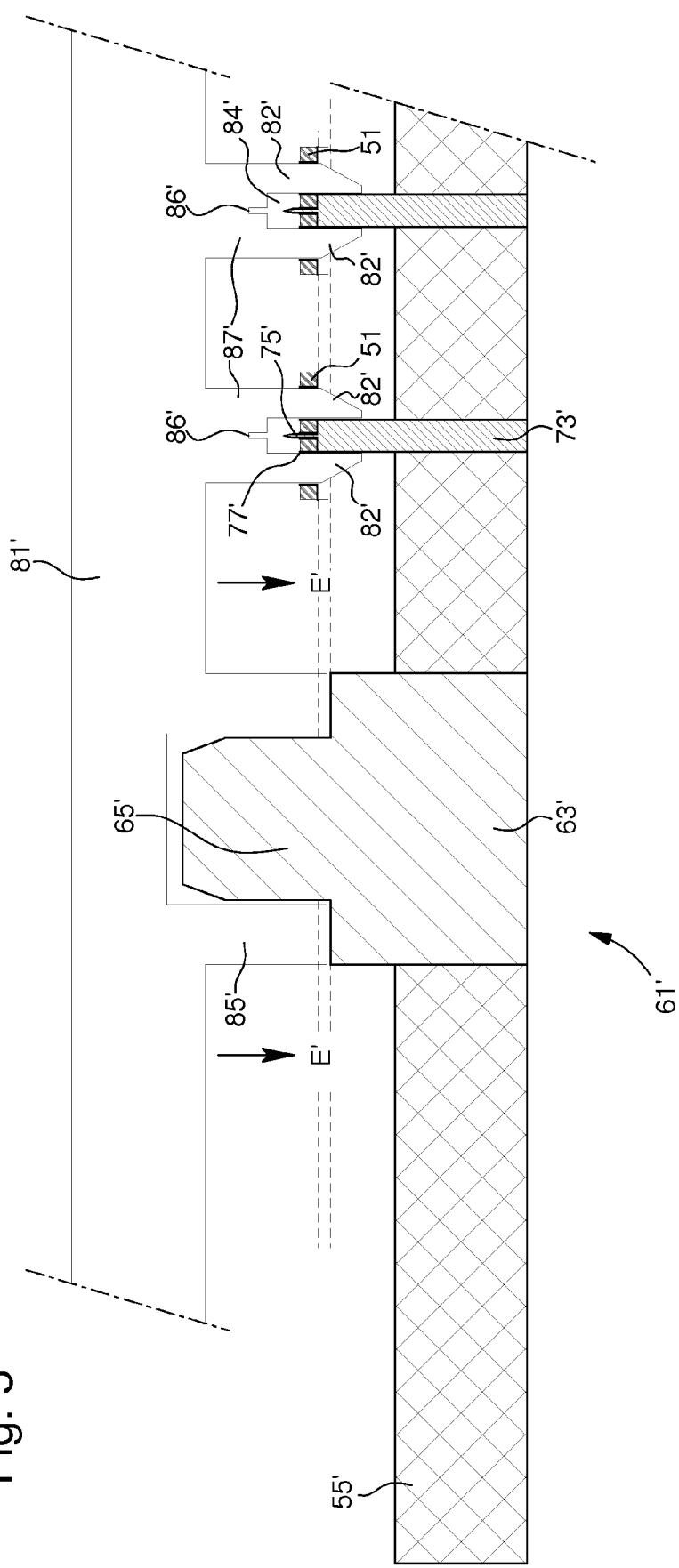
FIG. 5 is a diagram of a counter-support assembly step according to the invention.

As visible in FIG. 5 at the end of phase 29, counter-support 81' partially covers each pin 71' passing through an associated part 51 but also through the high parts 65' of each stem 61'. In the example illustrated on the pattern at the top right of FIG. 2, three teeth 82' of a fork 87' can be seen, whose shape corresponds to the free space between two arms of escape wheel 51. Of course, forks 87' will be adapted depending upon the part 51 being manufactured. Counter-support 81' is preferably formed from a material that does not damage part 51 like, for example, a plastic polymer.

Alignment means 60', 85' are preferably located higher vertically than stems 61' and parts 51 so as to guarantee the consecutiveness of the first time period and the second time period.

Figure 6:
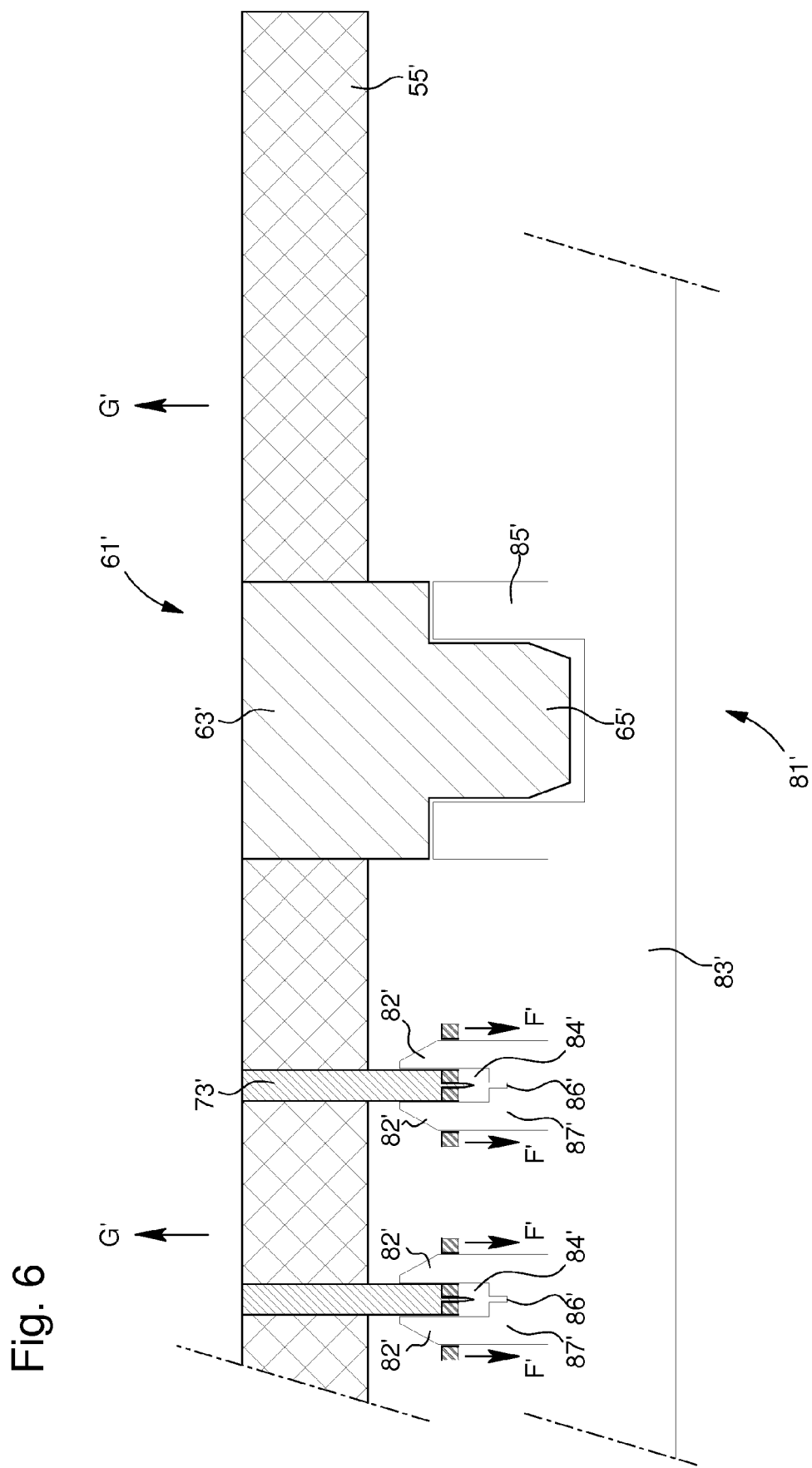
FIG. 6 is a diagram of a turning over step according to the invention.

In a second phase 31 illustrated in FIG. 6, the support 55'-counter-support 81' assembly is turned over then support 55' is removed along direction G' so as to slide each part 51 along direction F' against the teeth 82' of forks 87' until the parts each rest against the bottom of space 84' delimited by teeth 82'.

Figure 7:
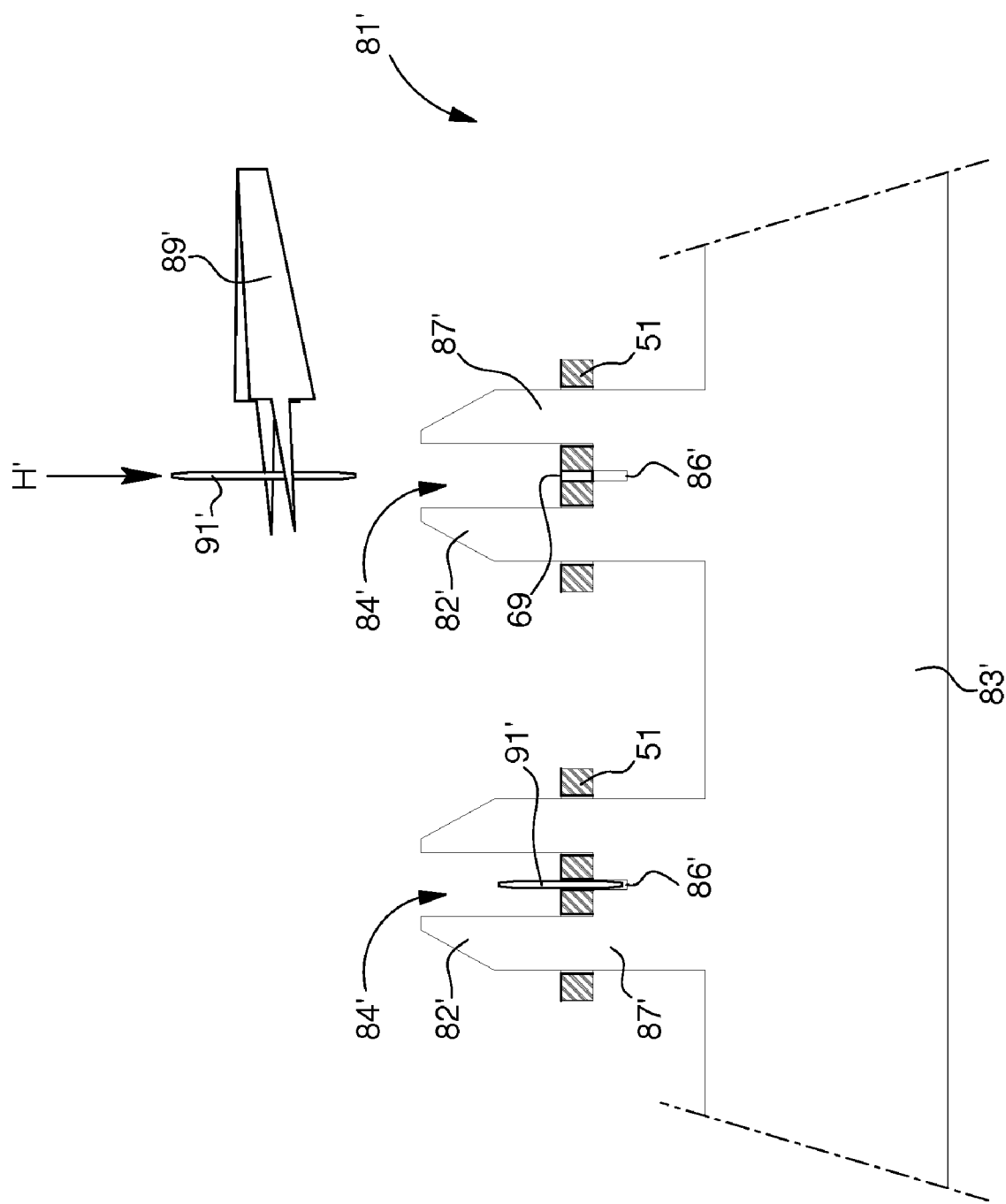
FIG. 7 is a diagram of a clip assembly step according to the invention.

In third phase 33 of sixth step 13, a clip 91' is assembled on each part 51 mounted against counter-support 81'. The example illustrated in FIG. 7 shows a first, assembled part 51 and a second part 51, further to the right, whose clip 91' is not yet assembled. Of course, FIG. 7 is used for better comprehension. Assembly of clips 91' is not limited to one-by-one assembly using tweezers 89', but may of course be performed at the same time for each part 51 using an automated machine.

As visible in the non-assembled part 51 to the right, first of all, clip 91' is moved along translation H' towards the pierced centre 69 of the part 51 contained in space 84', which is delimited by teeth 82'. The maximum translation of clip 91' relative to centre 69 is preferably delimited by the height of hole 86' made in the extension of space 84', which enables clip 91' to be reliably mounted relative to part 51.

Secondly, once all of clips 91' have been positioned on all of parts 51, clip 91' and part 51 are secured to each other definitively, for example by being heated in a furnace until the adhesive, present on each clip 91', polymerises which has the effect of securing each clip 91' in its associated centre 69.

At the end of step 13, a counter-support 81' carrying pre-assembled parts 51 is thus obtained. Advantageously, according to the invention, the dozens of parts 51 can thus still be handled together and they can be supplied with counter-support 81' directly to the production line of a device, such as for example a timepiece movement. It then becomes possible to move each part 51 by directly gripping clip 91', which means that the final assembly of each part 51 can be carried out without any direct handling of the micro-machinable material and/or the deposited coating.

In the example illustrated in FIGS. 1 and 2, part 51 is an escape wheel and clip 91' is its pivoting arbour. However, the invention is in no way limited to this and, by way of example, part 51 could be another type of gear train, a crown or even a balance spring-collet assembly, just as clip 91' could be a different function part from a pivoting pin.

Of course, the present invention is not limited to the illustrated example but is capable of various variants and alterations which will appear to those skilled in the art. In particular, step 9 is provided for the case in which the micro-machinable material has insufficient tribological features for the intended application of part 51. However, if the micro-machinable material includes sufficient features, a third embodiment of method 1 could include the consecutive steps 3, 5, 7, 11 and possibly step 13.

Finally, the relative movement in step 11 between parts 51 and substrate 53 of the first and second embodiments is in no way limited to movement along direction D'. Thus, the relative movement could be achieved by any known means, such as, for example, by pins 71' and/or stems 61' mounted so as to move relative to support 55'.

What is claimed is:

1. A method of manufacturing a mechanical part comprising the steps of:
   (a) providing a substrate of micro-machinable material;
   (b) etching, using photolithography, a pattern that includes the mechanical part, through the entire substrate;
   (c) mounting the etched substrate on a support so as to leave top and bottom surfaces of the substrate accessible for coating of both the top and bottom surfaces, guiding the substrate relative to the support using alignment means so as to orient the substrate in a predetermined manner, and sliding the substrate against at least one pin secured to the support until the substrate abuts against a shoulder of the at least one pin made at a distance from the support so as to keep the substrate high up relative to the support;
   (d) depositing a coating of better tribological quality than the micro-machinable material on an outer surface of the mechanical part; and
   (e) releasing the mechanical part from the substrate.

2. The method according to claim 1, wherein the alignment means are located higher than said at least one pin so as to guarantee the consecutiveness of the guiding of the substrate relative to the support using the alignment means and then the sliding of the substrate against the at least one pin secured to the support in step (c).

3. The method according to claim 1, wherein the support includes several alignment means so as to improve the guiding of the substrate relative to the support using the alignment means in step (c).

4. The method according to claim 1, wherein the alignment means include at least one column secured to the support for cooperating with a recess made in the substrate in step (b).

5. The method according to claim 4, wherein each recess is made in proximity to ends of the substrate.

6. The method according to claim 4, wherein each recess corresponds to an empty space in the pattern.

7. The method according to claim 1, wherein, in step (b), at least one bridge of material is etched in the pattern so as to keep the mechanical part secured to the substrate.

8. The method according to claim 7, wherein said at least one bridge of material includes a narrow section at an end connected to the mechanical part for creating a zone of weakness that facilitates step (e).

9. The method according to claim 7, wherein step (e) is achieved by a relative movement between the substrate and the mechanical part so as to break said at least one bridge of material.

10. The method according to claim 1, wherein the steps are performed exactly in the order of (c), then (e), then (d).

11. The method according to claim 1, wherein the substrate is thinned between steps (a) and (b) so as to adapt the final thickness of the mechanical part.

12. The method according to claim 1, wherein, in that several mechanical parts are manufactured from the same substrate.

13. The method according to claim 1, wherein step (b) includes the following sub-steps of:
   (i) structuring a protective mask in a shape matching the mechanical part on the substrate to form a substrate-mask assembly;
   (ii) anisotropic etching the substrate-mask assembly; and
   (iii) removing the protective mask.

14. The method according to claim 13, wherein said protective mask is made using a photosensitive resin.

15. The method according to claim 1, wherein said micro-machinable material is chosen from among the group consisting of crystalline silicon, crystalline silica, and crystalline alumina.

16. The method according to claim 1, wherein the mechanical part is a micro-mechanical part for mounting in a timepiece.

17. A method of manufacturing a mechanical part comprising the steps of:
   (a) providing a substrate of micro-machinable material;
   (b) etching, using photolithography, a pattern that includes the mechanical part, through the entire substrate;
   (c) mounting the etched substrate on a support so as to leave top and bottom surfaces of the substrate accessible for coating of both the top and bottom surfaces;
   (d) depositing a coating of better tribological quality than the micro-machinable material on an outer surface of the mechanical part;
   (e) releasing the mechanical part from the substrate; and
   (f) after step (e), assembling a clip on the mechanical part so that the mechanical part is moveable via the clip without the mechanical part made of micro-machinable material having to be handled directly.

18. The method according to claim 17, wherein step (f) includes the following sub-steps
   (i) mounting a counter-support fitted with forks on the support to form a support-counter-support assembly so that the forks cooperate with the mechanical part;
   (ii) turning over the support-counter-support assembly, then removing the support so as to slide the mechanical part against the forks; and
   (iii) mounting a clip on the mechanical part.

19. The method according to claim 18, wherein sub-step (ii) further includes the following steps of
   guiding the counter-support relative to said support using alignment means so as to orient said counter-support in a predetermined manner; and
   sliding at least one tube and the forks respectively against a pin secured to the support and the mechanical part until the tube and the forks abut against a shoulder of the pin so as to prepare to turn over the support-counter-support assembly.

20. The method according to claim 17, wherein, in step (b), at least one bridge of material is etched in the pattern so as to keep the mechanical part secured to the substrate.

21. The method according to claim 20, wherein said at least one bridge of material includes a narrow section at an end connected to the mechanical part for creating a zone of weakness that facilitates step (e).

22. The method according to claim 20, wherein step (e) is achieved by a relative movement between the substrate and the mechanical part so as to break said at least one bridge of material.

23. The method according to claim 17, wherein the steps are performed exactly in the order of (c), then (e), then (d).

24. The method according to claim 17, wherein the substrate is thinned between steps (a) and (b) so as to adapt the final thickness of the mechanical part.

25. The method according to claim 17, wherein, in that several mechanical parts are manufactured from the same substrate.

26. The method according to claim 17, wherein step (b) includes the following sub-steps of
   (i) structuring a protective mask in a shape matching the mechanical part on the substrate to form a substrate-mask assembly;
   (ii) anisotropic etching the substrate-mask assembly; and
   (iii) removing the protective mask.

27. The method according to claim 26, wherein said protective mask is made using a photosensitive resin.

28. The method according to claim 17, wherein said micro-machinable material is chosen from among the group consisting of crystalline silicon, crystalline silica, and crystalline alumina.

29. The method according to claim 17, wherein the mechanical part is a micro-mechanical part for mounting in a timepiece.

* * * * *